(12) United States Patent
Thoman et al.

(10) Patent No.: US 7,284,600 B2
(45) Date of Patent: Oct. 23, 2007

(54) PROCESS OF MAKING A LIGHTWEIGHT THERMAL HEAT TRANSFER APPARATUS

(75) Inventors: Steve Thoman, Leonardtown, MD (US); Ronald Trabocco, Trappe, PA (US); Mary Donnellan, Boalsburg, PA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/602,441

(22) Filed: Nov. 9, 2006

(65) Prior Publication Data

US 2007/0199689 A1 Aug. 30, 2007

Related U.S. Application Data

(62) Division of application No. 10/056,812, filed on Jan. 24, 2002, now Pat. No. 7,156,161.

(51) Int. Cl.
 *B21D 53/02* (2006.01)
 *F28F 7/00* (2006.01)

(52) U.S. Cl. .................................. 165/185; 29/890.03

(58) Field of Classification Search ............... 165/185, 165/905, 906; 29/888.044, 888.045, 888.046, 29/890.03; 501/95.1, 95.2
See application file for complete search history.

(56) References Cited

U.S. PATENT DOCUMENTS

| | | | |
|---|---|---|---|
| 2,992,317 A | 7/1961 | Miller | |
| 3,106,756 A | 10/1963 | Demaison | |
| 3,137,893 A | 6/1964 | Gelpke | |
| 3,378,613 A | 4/1968 | Hampshire | |
| 3,485,695 A * | 12/1969 | Ness | 156/229 |
| 4,992,317 A | 2/1991 | Chess | |
| 5,192,597 A * | 3/1993 | Forsythe | 428/34.5 |
| 5,793,603 A | 8/1998 | Lyman | |
| 5,975,201 A | 11/1999 | Roberts | |
| 6,110,567 A | 8/2000 | Bird | |
| 6,696,669 B2 * | 2/2004 | Hembree et al. | 219/209 |
| 2002/0150822 A1 * | 10/2002 | Marlow et al. | 429/241 |

FOREIGN PATENT DOCUMENTS

| | | | |
|---|---|---|---|
| JP | 04352862 A | * | 12/1992 |
| JP | 2003222740 A | * | 8/2003 |

* cited by examiner

*Primary Examiner*—Tho Duong
(74) *Attorney, Agent, or Firm*—Mark O. Glut

(57) ABSTRACT

A lightweight thermal heat transfer apparatus, including a core section and a laminate composite section. The core section is substantially similar to a diamond shape. The laminate composite section has a plurality of thermally conductive fibers, which are disposed around the core section and oriented at a configuration similar to the core section.

7 Claims, 2 Drawing Sheets

PROCESS OF MAKING A LIGHTWEIGHT THERMAL HEAT TRANSFER APPARATUS

CROSS REFERENCES

This application is a division of application Ser. No. 10/056,812, filed Jan. 24, 2002 now U.S. Pat. No. 7,156,161, entitled Lightweight Thermal Heat Transfer Apparatus.

STATEMENT OF GOVERNMENT INTEREST

The invention described herein may be manufactured and used by or for the Government of the United States of America for governmental purposes without payment of any royalties thereon or therefor.

BACKGROUND

The present invention relates to a lightweight thermal heat transfer apparatus, which provides an efficient thermal conduction path from a thermal source. More specifically, but without limitation, the present invention relates to a lightweight thermal heat transfer apparatus that can function either as a heatsink and/or a heat dissipative fin that can be used in conjunction with electronic equipment.

A heatsink, a heat dissipative fin and/or a thermal heat transfer apparatus is typically, but without limitation, an apparatus which has high thermal conductivity and lowers the temperature as well as draws heat from a thermal source. Typically a heat sink, a heat dissipative fin and/or a thermal heat transfer apparatus dissipates, scatters, disperses heat, or even makes heat disappear. A heatsink, a heat dissipative fin, and/or a thermal heat transfer apparatus also provides a thermal conductive path away from a thermal source.

Heat sinks, heat dissipative fins and/or thermal heat transfer apparatuses are widely used in the electronics industry to provide passive thermal control of electronic components. Aluminum, copper and other metals or metal alloys have been used for these applications. However, as electronic components have decreased in size, power density has increased. These factors have resulted in higher heat dissipation requirements in electronic components than conventional materials and designs can provide. The power levels and power densities of many current electronic designs are limited by the heat dissipative capabilities of their heatsinks, heat dissipative fins and/or thermal heat transfer apparatuses.

For a variety of electronic applications, such as aircraft or aerospace applications, it is highly desirable to minimize the weight of the heatsink, the heat dissipative fin and/or the thermal heat transfer apparatus and maximize its heat dissipative capabilities.

Laminated composites have been used to manufacture heatsinks, heat dissipative fins and/or thermal heat transfer apparatuses. The use of laminated composites, composed of fibers and a matrix material, as heat sinks, heat dissipative fins and/or thermal heat transfer apparatuses has not resulted in as much thermal conductivity as was originally anticipated because the transverse thermal conductivity of these fibers is an order of magnitude less than axial thermal conductivity. Thus there is a requirement for a new thermal heat transfer apparatus that provides a direct thermal path along the fiber axis from the surface of the thermal heat transfer apparatus to its edge. This requirement would provide more thermal conductivity and minimize weight and size of the heatsink, heat dissipative fin and/or thermal heat transfer apparatus.

For the foregoing reasons, there is a need for a lightweight thermal heat transfer apparatus. Information relevant to attempts to address these problems can be found in U.S. Pat. Nos. 4,609,586, 4,849,858, 4,867,235, 4,888,247, 5,002,715, 5,111,359, 5,287,248, 5,255,738, 5,224,030, and 5,316,080. (None of these patents are admitted to be prior art with respect to the present invention.) However, each of these references suffers from one of the above listed disadvantages.

SUMMARY

The present invention is directed to a lightweight thermal heat transfer apparatus that satisfies the needs listed above and below.

It is an object of the present invention to provide a lightweight thermal heat transfer apparatus that includes a core section and a laminate composite section. The core section may be substantially diamond shaped. The laminate composite section has a plurality of thermally conductive fibers. The thermally conductive fibers are disposed around the core section and are oriented at a configuration similar to the core section.

It is an object of the present invention to provide a lightweight thermal heat transfer apparatus that transfers heat multidirectionally away from an apparatus that generates heat.

It is an object of the present invention to provide a lightweight thermal heat transfer apparatus that is lightweight and an effective thermal conductor.

It is an object of the present invention to provide a lightweight thermal heat transfer apparatus that can be used as either a heatsink, a heat dissipative fin or as a cooling fin, or in other applications where thermal conduction is required of a plate-shaped conduit.

It is an object of the present invention to provide a lightweight thermal heat transfer apparatus that provides a configuration in which heat flux is relatively constant along paths through the lightweight heat transfer apparatus.

It is an object of the present invention to provide a lightweight thermal heat transfer apparatus that provides a direct thermal path along the fiber axis from the surface of the lightweight thermal heat transfer apparatus to its edges.

DRAWINGS

These and other features, aspects and advantages of the present invention will become better understood with reference to the following description and appended claims, and accompanying drawings wherein:

DESCRIPTION

Figure 1:
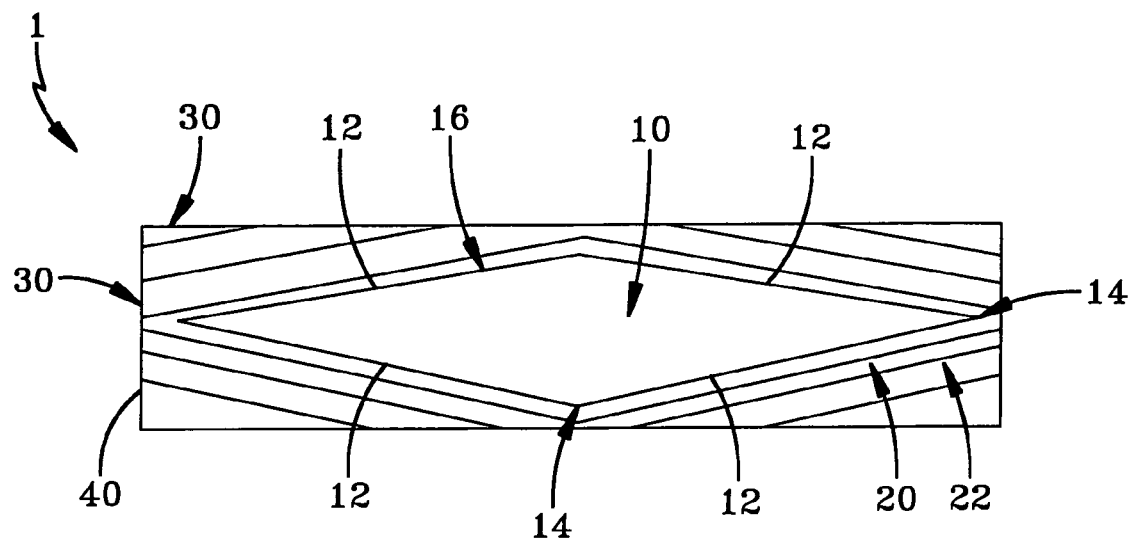
FIG. 1 is a cross sectional view of a lightweight thermal heat transfer apparatus.

The preferred embodiment of the present invention is illustrated by way of example in FIGS. 1, 2, 3 and 4. As shown in FIGS. 1, 2, 3 and 4 the lightweight thermal heat transfer apparatus 1 includes a core section 10 and a laminate composite section 20.

A laminate composite typically contains two or more interconnected thin layers, stratum, lamella, membranes, plates, folds, wafers, or the like. The laminate composite section 20 may have a plurality of thermally conductive fibers 22. Fibers are typically, but without limitation, thread-like structures, ropelike structures, or slender filaments that combine with others to form a substance and/or very fine continuous strands. Thermally conductive fibers 22 are fibers that have the ability to transmit, conduct, transport, carry to or take from one place to another, transfer or convey heat. The plurality of thermally conductive fibers 22 may be imbedded in a matrix. The matrix material may be a polymer or a polymer with metallic and/or thermally conductive chopped-fiber additions. A polymer is typically defined, but without limitation, as a compound of high molecular weight derived either by the addition of many smaller molecules or by condensation of many smaller molecules with the elimination of water, alcohol, or the like. The matrix material may also be of a metallic or ceramic composition. The lightweight thermal heat transfer apparatus 1 may also include off-axis thermally conductive fibers 22 that are both continuous and discontinuous to aid heat flow across the principal fiber directions.

The thermally conductive fibers 22 may be isotropic (having similar properties in every direction), or anisotropic (having different properties in different directions). Thermally conductive fibers 22 that are anisotropic and made from mesophase pitch material are preferred. A mesophase pitch material is defined as, but without limitation, a material created from a form of tar or pitch (a heavy liquid or dark residue obtained by the distillation of tar) followed by repeated stretching and exposure to elevated temperatures to convert the material to graphite fibers that are in an intermediate, nematic (being in a phase characterized by arrangement of long axes in parallel lines but not layers) or smectic (being in a phase characterized by arrangement of molecules in layers with long molecular axes) stage. Exposure temperatures could be as high as about 3500 degrees Celsius in an inert atmosphere. Thermally conductive fibers 22 made from mesophase pitch material typically assume a two-dimensional graphitic crystalline structure along the fiber axis, and posses thermal conductivities ranging from about 100 to about 1100 W/m degrees Kelvin and have a density of about 2 to about 2.5 g/cc. The thermal conductivities of thermally conductive fibers 22 manufactured from mesophase pitch material are typically 2-3 times greater then the thermal conductivities of copper, a material often used in applications where high thermal conductivities are required. The thermally conductive fibers 22 manufactured from mesophase pitch material also posses extremely high moduli (about $100 \times 10$(to the $6^{th}$ power) psi, modulus is typically defined as the measure of a force or properties of mass or their effects), and also posses high strength (about 300 ksi).

The thermally conductive fibers 22 may also be made from carbon fiber. A thermally conductive fiber 22 made from carbon fiber is produced from polyacrylonitrile (PAN) and is stretched and exposed to elevated temperatures as high as about 2500 degrees Celsius. Thermally conductive fibers 22 made from carbon fiber have thermal conductivities ranging from about 10 to about 70 W/m degrees Kelvin. They also posses high strength (about 400 to about 500 ksi), and high moduli (about 40 to about $50 \times 10$(to the $6^{th}$ power) psi). The thermally conductive fibers 22 made from carbon fiber typically have a density of about 1.8 g/cc.

Metallic additions to the thermally conductive fibers 22 may be added, and also may be in the form of coatings. Metallic additions may be dispersed in the matrix and may be in the form of flakes, chopped fibers, lenticular shapes, and the like. Thermally conductive fibers may also be added in the translaminar (through-thickness) direction to further aid in heat dissipation. These fibers could be discontinuous and dispersed in the matrix or continuous and inserted through the thickness of the laminate.

The laminate composite section 20 may be produced using compression molding, oven or autoclave operations, resin transfer molding or any other method compatible with fabrication of such a polymeric matrix configuration.

The thermally conductive fibers 22 may be supported by pitched-based fibrous reinforcements. The pitched-based fibrous reinforcements are typically an added piece, a support, a material, or an apparatus, device or system that strengthens the thermally conductive fibers 22. The pitched-based fibrous reinforcements can be made from material similar to the thermally conductive fibers 22; however, the pitched-based fibrous reinforcements are shaped in a manner to effectively reinforce the thermally conductive fibers 22. An example would be a triangle shape in apex regions of the core section 10 or a variety of shapes used for similar purposes dependent on the interior or core section 10 space geometry. The volume occupied in these core section 10 regions would be further dependent on the degree of reinforcement required.

Figure 2:
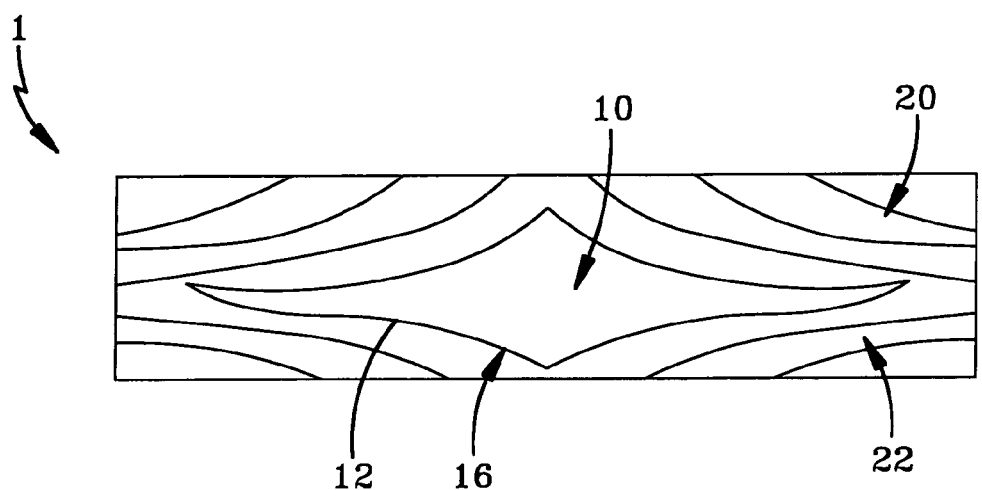
FIG. 2 is a cross sectional view of a lightweight thermal heat transfer apparatus with increased fiber intersect angles.

A core section 10 is typically the central part of a heat transfer apparatus. The thermally conductive fibers 22 may be disposed around the core section 10. The core section 10 may be a variety of shapes. The preferred shape of the cross sectional area of the core section 10 is substantially similar to a diamond shape. A diamond shape can include, but without limitation, a lozenge or a rhombus shape. A rhombus is typically an equilateral parallelogram, especially one with oblique or slanting angles. A lozenge is typically a four-sided equilateral figure whose opposing angles are equal. The core section 10 may contain core edges or a core interface 16. The core edges or core interface 16 is the surface regarded as the common boundary of the core section 10 and the laminate composite section 20 or the thermally conductive fibers 22. The core edges or core interface 16 may be straight lines, curved or arced lines. The curvature of the core edges or core interface 16 may be hyperbolic, parabolic, or any type of curvature. The curvature of the core edges or core interface 16 may be changed to optimize the volume of the thermally conductive fibers 22 to suit the needs of the application. In the preferred embodiment, the thermally conductive fibers 22 are orientated at a configuration similar to the core section 10. The core section 10 may have four core section sides 12 and four core section apexes 14 (pointed ends or tips). The four core section sides 12 make up the core edges or core interface 16. As shown in FIG. 1, each core section side 12 may have a plurality of thermally conductive fibers 22 parallel to it. In another embodiment of the invention, as shown in FIG. 2, the thermally conductive fibers 22 may have an increased fiber intersect angle. In this embodiment, the thermally conductive fibers 22 may be curved, rounded, hyperbolic, parabolic, ellipsoidal, arced or be shaped as a part of a circle and not aligned as a straight line. In another embodiment, the curvature of the core section sides 12 can be substantially varied to correspond to functions such as $X$, $X^2$, $X^3$, $e^x$, etc.

The lightweight thermal heat transfer apparatus 1 can be substantially similar to the shape of a parallelogram, while the cross sectional area may also be substantially similar to the shape of a parallelogram. A parallelogram is typically defined as a four-sided plane figure having the opposite side parallel and equal. A parallelogram may include, but is not limited to, a square, a rectangle, and a rhomboid. A rectangle is typically a four-sided plane figure with four right angles, while a square typically has four equal sides and four right angles. The lightweight thermal heat transfer apparatus 1 has edges 30, borders or margins as defined by its shape. These edges 30 may be straight, arced, curved or rounded. The edges 30 may also be the exterior or external laminate or exterior or external thermally conductive fibers 22 or laminate composite section 20.

In one of the many possible embodiments, the edges 30 of the lightweight thermal heat transfer apparatus 1 are coated with a conductive coating 40. A coating is defined, but without limitation, as a layer of any substance spread over a surface. The conductive coating 40 may be a coating of pure metal or an alloy. A metal is typically, but without limitation, defined as an electropositive chemical element characterized by ductility, malleability, luster, conductivity of heat and electricity. An alloy is typically defined, but without limitation, as a mixture of two or more metallic elements or non-metals which has a metallic appearance and/or some metallic properties. Copper, nickel, silver, gold, aluminum, alloys of these metals, as well as various combinations such as copper molybdenum, boron nitride and beryllium-aluminum can be used as conductive coatings. Diamond coatings may also be used as a conductive coating 40 because of their super high conductivity. A diamond coating may be defined, but without limitation, as a coating made from a crystalline carbon which typically contains colorless or tinted isometric crystals. The diamond coating may be made from a naturally occurring, industrial or synthetic crystalline carbon. The conductive coating 40 should posses good thermal conductivity and have reasonable adherence to the edges 30 of the lightweight thermal heat transfer apparatus 1. Coating an edge 30 of the lightweight thermal heat transfer apparatus 1 provides a conductive path for off axis fibers from the side wedge (any surface of the interior) to the cold-wall edge (those surfaces where the ends of the thermal conducting fibers terminate). A coated cold-wall edge will insure intimate contact with all the conductive fiber ends at the edge of the laminate. This will prevent localized degradation in thermal performance.

The thermally conductive fibers 22 may be disposed at non-zero, non-right angles or oblique (neither perpendicular nor parallel to a given line or surface) angles to the edges 30 of the lightweight thermal heat transfer apparatus 1. In the preferred embodiment, the thermally conductive fibers 22 are disposed at an angle to the edges 30 and none of the thermally conducted fibers 22 are parallel or perpendicularly orthogonal (at a right angle) to any of the edges 30.

The core section 10 may be hollow. The core section 10 may be a material selected from the group of air, foam, fluid and/or honeycomb. The foam or honeycomb may be polymeric or metallic in nature, with additions of the opposite material in the case of the foam to enhance desired properties. Such an approach allows for significant weight savings, approximately 33% over a conventionally configured (without a lightweight core) composite. The core section 10 may also be made from a solid polymeric based system of materials, which is a group of materials whereby the primary material is a polymer mixed in with other materials. Both thermoset (rendered hard by heat) and thermoplastic (rendered soft and moldable by heat) polymeric materials could be used to make the core section 10. The polymeric based core section 10 may be manufactured using injection molding, compression molding, extrusion, oven or autoclave curing operations, resin transfer molding, vacuum assisted resin transfer molding, or any other type of manufacturing process that lends itself to producing a polymeric based system of materials. The polymeric-based foam or solid core options could also employ continuous as well as discontinuous thermally conductive fibers. Metallic additions to the polymers may be used to further improve thermal conductivity. The metallic additions to the polymer-based core section 10 may be in the form of flakes, chopped fibers, lenticular shapes, or coatings or graphite fibers, and the like. Metallic additions irrespective of form would enhance transverse fiber conductivity.

If a hollow configuration is used, additional thermal dissipation may be achieved by fluid convection. Convection is typically defined, but not limited to, a movement of parts of a fluid within the fluid because of differences in heat, and heat transference by such movement. Fluids are typically either liquid or gas. By forcing air or other fluids through a hollow core section, additional heat flow may be realized. A number of fluids can be used to effect thermal transport. Aqueous-based liquids with additives such as ethylene glycol, petroleum-based fluids and silicone-based fluids are a few examples of the many types of different fluids that may be used to realize additional heat flow. Additives are also effective in retarding oxidation and degradation as well as enhancing thermal efficiency. The selection of a particular fluid would be dependent on the thermal service conditions, among other factors.

Figure 3:
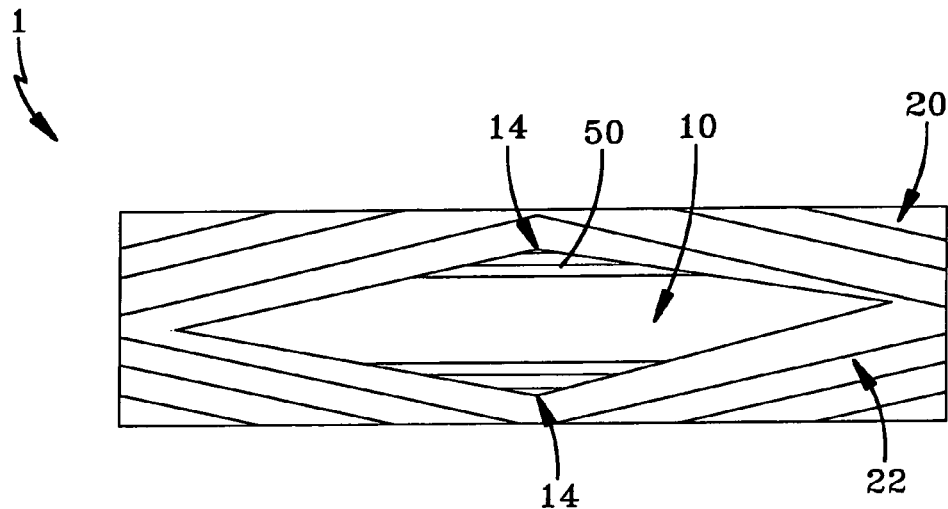
FIG. 3 is a cross sectional view of a lightweight thermal heat transfer apparatus with plies.

Stiffening an apex 14 of the core section 10 may be required to meet the structural requirements of some applications. The apexes 14 may be stiffened by adding a plurality of plies 50. The plurality of plies 50 may be added to a pair of opposite or across from each other apexes 14 of the core section 10. A ply 50 is typically, but without limitation, a thickness or layers of material in a particular area. The plies 50 can be additional layers of thermally conductive fibers 22 that give the local area support. The lightweight thermal heat transfer apparatus 1 may contain several groups of plurality of plies 50. The groups may be placed at each individual apex 14. As shown in FIG. 3, the preferred embodiment includes two groups of a plurality of plies 50, one group of the plurality of plies 50 is attached at one apex 14, and the other group of plurality of plies 50 is attached at an opposite apex 14.

Figure 4:
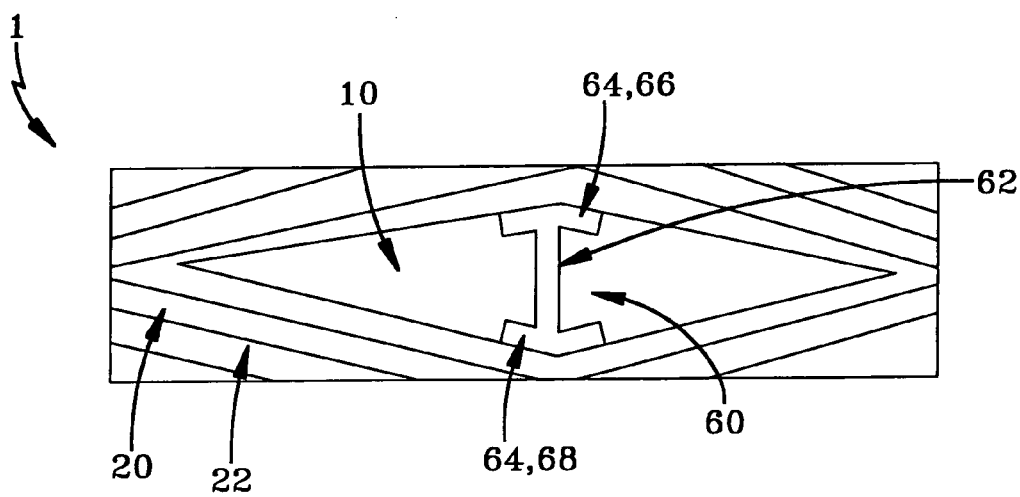
FIG. 4 is a cross sectional view of a lightweight thermal heat transfer apparatus with a stiffener.

The lightweight thermal heat transfer apparatus 1 may also include a stiffener 60 to allow support for the thermally conductive fibers 22 and to maintain the shape of the core section 10. The stiffener 60 may include a stiffener shaft portion 62 and two stiffener supports 64 on opposite ends of the stiffener shaft portion 60. As shown in FIG. 4, the two stiffener supports 64 may be disposed at opposite apexes 14. The stiffener 60 may be substantially I-shaped with a top line 66 and a bottom line 68. The top line 66 and the bottom line 68 may be the two stiffener supports 64. The two stiffener supports 64 may slope or angle downward or upward at the stiffener shaft portion 62. The stiffener top line 66 and bottom line 68 (each respective stiffener support 64) correspond to the thermally conductive fibers 22. The stiffener 60 may be manufactured from any metal, metal alloy, plastic, ceramic, rubber or any type of material. The stiffener 60 may be produced from the thermally conductive fibers 22. This type of configuration would promote what is known to one skilled in the art as Z-direction heat transfer. The stiffener 60 may be manufactured from carbon fiber-reinforced polymeric composites, graphite fiber-reinforced polymeric composites, or a composite of fiber with metal or plastic or both. Metallic additions may be used in the stiffener to improve thermal conductivity properties.

The geometry shown in the lightweight thermal heat transfer apparatus 1 uses more conductive material where, in a conventional heatsink, the heat flux is large. Similarly it uses less material when the heat flux is normally small. Heat flux is typically an indication of the thermal transport for specific configurations and their boundary conditions. Heat flux is proportional to the change in temperature with respect to distance. In a steady state condition, heat flux of a conventional heat sink is greatest at its edge and a minimum at its center. The geometry of the lightweight thermal heat transfer apparatus 1 provides a configuration in which heat flux is relatively constant along an axis through the lightweight heat transfer apparatus 1. The geometry also provides a direct thermal path along the fiber axis from the surface of the lightweight thermal heat transfer apparatus 1 to its edge 30.

The lightweight thermal heat transfer apparatus 1 may be constructed using many various fabrication techniques. One such technique is by fabricating an oval with the thermally conductive fibers 22. The oval is then cut into quadrants. The quadrants are aligned around a substantially diamond shaped core section 10 such that the diamond shape is maintained. Another possibility is by building the laminate ply-by-ply or fiber-by-fiber and staggering the ply lengths to permit outer skin laminate to exhibit a half diamond-like shape. A core section 10 could then be bonded to the two such laminates resulting in the preferred embodiment of the present invention. The core section 10 may be manufactured using any method that provides the designed core geometry. One method is to fabricate the core section 10 from low-density foam, which collapses when pressure is applied during processing, yet still, maintains its diamond shape. Another method is to machine a core section 10 from a larger piece of foam or material.

Although the present invention has been described in considerable detail with reference to certain preferred versions thereof, other versions are possible. Therefore, the spirit and scope of the appended claims should not be limited to the description of the preferred versions contained herein.

Any element in a claim that does not explicitly state "means for" performing a specified function, or "step for" performing a specific function, is not to be interpreted as a "means" or "step" clause as specified in 35 U.S.C. 112 paragraph 6. In particular, the use of "step of" in the claims herein is not intended to invoke the provisions of 34 U.S.C. 112 paragraph 6.

What is claimed is:

1. A manufacturing process of making A lightweight thermal heat transfer apparatus comprising the steps of:
    (a) fabricating an oval with thermally conductive fibers;
    (b) cutting the oval into quadrants; and
    (c) aligning the quadrants around a substantially diamond shaped core section such that the substantially diamond shape of the core section is maintained.

2. The process of claim 1, wherein the thermally conductive fibers are manufactured from a mesophase pitch material, the mesophase pitch material is prepared by
    (a) distilling pitch, and
    (b) repeated stretching and exposure to temperature as high as 3500 degrees Celsius until the pitch is converted to graphite fibers that are in an intermediate stage.

3. The process of claim 2, wherein the mesophase pitch material has a density in a range of about 2 to about 2.5 g/cc.

4. The process of claim 3, wherein the mesophase pitch material has a thermal conductivity in a range of about 100 to about 1100 W/m degrees Kelvin.

5. The process of claim 1, wherein the thermally conductive fibers are manufactured from carbon fiber.

6. The process of claim 5, wherein the carbon fiber has a density of about 1.8 g/cc.

7. The process of claim 6, wherein the carbon fiber has a thermal conductivity in a range of about 10 to about 70 W/m degrees Kelvin.

* * * * *